(12) United States Patent
Feke et al.

(10) Patent No.: US 6,689,529 B2
(45) Date of Patent: Feb. 10, 2004

(54) METHOD FOR MEASURING DIFFUSION OF PHOTOGENERATED CATALYST IN CHEMICALLY AMPLIFIED RESISTS

(75) Inventors: Gilbert D. Feke, Southbridge, MA (US); Robert D. Grober, Milford, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 09/837,853

(22) Filed: Apr. 17, 2001

(65) Prior Publication Data

US 2002/0001768 A1 Jan. 3, 2002

Related U.S. Application Data

(60) Provisional application No. 60/198,075, filed on Apr. 17, 2000.

(51) Int. Cl.[7] .................................................. G03C 5/16
(52) U.S. Cl. .................. 430/139; 430/270.1; 250/458.1
(58) Field of Search .............................. 430/139, 270.1, 430/374; 250/458.1

(56) References Cited

U.S. PATENT DOCUMENTS

| | | | | |
|---|---|---|---|---|
| 4,102,687 A | | 7/1978 | Crivello .................. 96/115 R |
| 4,268,603 A | * | 5/1981 | Sato ........................ 430/196 |
| 4,371,605 A | | 2/1983 | Renner ...................... 430/280 |
| 4,491,628 A | | 1/1985 | Ito et al. ..................... 430/176 |
| 4,774,339 A | | 9/1988 | Haugland et al. ........... 548/405 |
| 4,945,171 A | | 7/1990 | Haugland et al. ........... 549/224 |
| 4,946,759 A | | 8/1990 | Doessel et al. ............. 430/270 |
| 4,946,760 A | | 8/1990 | Elsaesser ................... 430/270 |
| 5,043,265 A | | 8/1991 | Tanke et al. ................... 435/6 |
| 5,210,000 A | | 5/1993 | Thackeray et al. .......... 430/165 |
| 5,227,487 A | | 7/1993 | Haugland et al. ............. 546/15 |
| 5,252,435 A | | 10/1993 | Tani et al. .................. 430/325 |
| 5,258,257 A | | 11/1993 | Sinta et al. ................. 430/192 |
| 5,302,731 A | | 4/1994 | Pitner et al. ................ 549/394 |
| 5,352,564 A | | 10/1994 | Takeda et al. .............. 430/270 |
| 5,387,527 A | | 2/1995 | Sternberg ................... 436/518 |
| 5,442,045 A | | 8/1995 | Haugland et al. ........ 530/391.3 |
| 5,492,793 A | | 2/1996 | Breyta et al. ........... 430/270.14 |
| 5,625,020 A | | 4/1997 | Breyta et al. ............. 526/329.2 |
| 5,712,078 A | | 1/1998 | Huang et al. ............. 430/270.1 |
| 5,882,844 A | | 3/1999 | Tsuchiya et al. .......... 430/288.1 |
| 5,928,841 A | | 7/1999 | Ushirogouchi et al. ..... 430/325 |
| 6,376,149 B1 | * | 4/2002 | Grober et al. .............. 430/139 |
| 2001/0001698 A1 | | 5/2001 | Grober et al. .............. 430/139 |

FOREIGN PATENT DOCUMENTS

EP   1087260 A1   3/2001   ........... G03F/7/004

OTHER PUBLICATIONS

Tables 21.1 and 21.3;Section 21.3;structures R–6111 and A–1302 from www.probes.com Jun. 10, 2002.*
van Oijen et al. "Far–field fluorescence microscopy beyond the diffraction limit." J. Opt. Soc. Am. A., vol. 16, No. 4, Apr. 1999, pp. 909–915.
Guilbault. "Practical Fluorescence." Marcel Dekker, Inc., NY, pp. 597–607.
Haugland. "Handbook of Fluorescent Probes and Research Chemicals." Molecular Probes, Inc., 1996, Chapter 23, pp. 552–570.

* cited by examiner

*Primary Examiner*—Janet Baxter
*Assistant Examiner*—Amanda C. Walke
(74) *Attorney, Agent, or Firm*—Ohlandt, Greeley, Ruggiero & Perle, LLP

(57) ABSTRACT

A method of imaging acid in a chemically amplified photoresist comprising the steps of: (a) exposing the chemically amplified photoresist to radiation thereby generating an acid, the chemically amplified photoresist comprising at least one species of pH-dependent fluorophore that fluoresces in the presence of the acid, the pH-dependent fluorophore being present at a concentration that enables the fluorescence from individual molecules of the pH-dependent fluorophore to be individually resolved; and (b) generating an image of the acid in the photoresist, the image comprising at least one or a plurality of discrete points corresponding to the fluorescent emission from an individual molecule or molecules of the pH-dependent fluorophore.

17 Claims, 5 Drawing Sheets

METHOD FOR MEASURING DIFFUSION OF PHOTOGENERATED CATALYST IN CHEMICALLY AMPLIFIED RESISTS

This application claims the benefit of provisional application Ser. No. 60/198,075 filed Apr. 17, 2000.

FIELD OF THE INVENTION

The present invention relates to the field of lithography and more specifically to measuring profiles of photoacid patterns in chemically amplified photoresists for use in the semiconductor industry.

BACKGROUND OF THE INVENTION

The use of chemically amplified photoresists (CARs) is common and increasingly important to the semiconductor industry. CARs continue to be developed in response to the increasingly demanding requirements of production lithography. A variety of acid catalyzed chemically amplified resist compositions have been used and continue to be developed. With chemically active resists, the radiation pattern incident at the wafer is recorded by a photogenerated catalyst, typically a strong Bronsted acid, which is produced by the photolytic decomposition of a photoacid generator (PAG) compound incorporated into the resist matrix. The photoacid is activated by a post exposure bake (PEB) to catalyze multiple chemical reactions in the resist matrix and thereby alter the dissolution rate. This process is called chemical amplification. The resist is then developed with the spatially dependent dissolution rate defining the ultimate pattern.

Exposure of a resist film to a radiation pattern during lithography produces what is known as the aerial image. The aerial image is transferred into the film as a catalyst image (i.e., a pattern of varying acid concentration) through photolysis of the PAG. The catalyst image is then transferred into a solubility image during the PEB by means of thermally activated catalysis. The term latent image is often used to describe either the catalyst image or the solubility image. Finally, the solubility image is transferred into patterned resist in the development step (i.e., the unexposed resist material is removed for the negative-tone case or the exposed resist material is removed for the positive-tone cse). The patterned resist is used as a local mask for the processing of the wafer.

The semiconductor industry requires that modem lithography use higher energy exposure sources to obtain greater spatial resolution in the aerial image. In the lithography process, the exposure time is of economic significance. A shorter exposure time will result in higher wafer throughput and lower production costs. The photospeed of CARs is enhanced by the amplification process during PEB. However, with this enhancement of photospeed comes the ability of the photoacid to diffuse from the exposed areas into the unexposed areas during PEB. This results in the blurring of the solubility image, which in turn leads to the blurring of the patterned resist. There is a need to both monitor and control photoacid location and activity.

The measurement of diffusion of the photogenerated catalyst in CARs is of major importance for the process control of the image formation of almost all of the lithographic techniques used today in the manufacture of microelectronic devices, including for example, integrated circuits and semiconductors. The diffusivity of an acid is measured by a quantity called D, the diffusion coefficient, which has units of length squared/time. The diffusion length (L) of an acid is given by the square root of 2 Dt, where t is the time elapsed during diffusion. Typical diffusion lengths are on the order of a few tens of nanometers. Because diffusion limits the lithographic resolution, it is a fundamental factor in the performance of CARs. Base additives are commonly used in resists to neutralize the acid and control diffusion. With the continued decrease in the dimensions of lithographic features, the ratio of the diffusion length to feature size continues to increase and the modeling and control of diffusion are becoming even more crucial issues in the design of resists and the optimization of processing conditions. The need for and the importance of measurement of diffusion of the photogenerated catalyst in chemically amplified resists is well established. Acid diffusion during post-exposure bake can markedly affect crucial dimensions and line width variation in semiconductors. The assessment of the photogenerated acid in photoresists is very significant in the manufacture of semiconductors, especially in view of increasing demand for higher circuit density in microelectronic devices. The present invention addresses this assessment need.

Precise control of the spatial distribution of photoacid during lithographic processing is paramount for maximizing lithographic resolution and minimizing critical dimension variation. An example of exercising this control is the focusing of the aerial image at the wafer. Another example is the design of resist compositions and optimization of processing conditions to minimize the diffusion of the acid from exposed to unexposed areas during PEB. Yet another example is the use of base additives to neutralize residual acid in the unexposed areas. In each of these examples, the objective is to maximize the sharpness of the photoacid concentration profiles. As the dimensions of lithographic features continue to decrease, the modeling, control, and monitoring of photoacid generation and diffusion are becoming even more crucial issues in the design and optimization of resist compositions and lithographic processes.

Photoacid distribution is generally inferred from developed patterns. However because developed patterns represent the convolution of each and every lithographic process, it is not possible to determine the photoacid distribution at each stage and hence unambiguously extract fundamental resist chemistry parameters or characterize individual processes. Furthermore, in many cases it may be desirable to inspect the outcome of a particular process before proceeding to the next step. Several methods of latent image detection have been developed in response to this problem. These include atomic force microscopy, thermal probe microscopy, photon tunneling microscopy, infrared microscopy, and fluorescence microscopy of resist doped with a pH indicator dye. The first four methods rely on contrast mechanisms resulting from variations in topography, thermal properties, refractive index, or polymer chemistry, which are essentially the result of variation in dissolution rate achieved after PEB. Fluorescence techniques, are unique by virtue of their spectroscopic, i.e., chemical, sensitivity and hence provide the ability to detect latent images before, as well as after, PEB.

At the concentrations reported to date for photoresists doped with pH-dependent dye that fluoresces in the presence of acid when exposed to radiation, the distance between dye molecules is much less than the size of the sampling area of the excitation light. These concentrations yield a continuum of acid detection across the field of view of the microscope. However, because of the limitations of optical (even near-field) microscopy, these techniques do not provide sufficient spatial resolution to detect acid concentration variations on length scales relevant to critical dimension control (i.e., less than 20 nm). The present invention addresses this need and limitation of the art.

Fluorescence detection of single molecules is a rapidly expanding field of contemporary research. Molecules have been isolated and studied in various environments, including polymer films and the measurement of acid concentration using pH sensitive single molecules embedded in an aqueous gel. Because an isolated fluorescent molecule is essentially an optical point source, its image traces out the microscope point spread function (PSF), generally a symmetric peaked function whose width is the resolution of the microscope. It has been demonstrated that the error in the measurement of the position of a signal of this type can be much less than the signal width, and is in fact only limited by the signal-to-noise ratio of the measurement. It is possible to localize single molecules to accuracies of tens of nanometers using only far-field microscopy.

In view of the previous discussion of demands and limitations in the semiconductor industry, it can be seen that there is a need to assess photogenerated acid having catalytic function in chemically amplified photoresists. Accordingly, an object of this invention is to provide a method for the measurement of photogenerated acid patterns in chemically amplified photoresists. It is also an object of this invention to provide a method for measurement of such photogenerated acid with accuracy at the nanometer level, preferably on the order of 10 nm, by means of localization of single, pH sensitive fluorescent molecules.

These and other objects and advantages of the invention and equivalents thereof, are described and provided in the drawings and descriptions that follow and manifest in the appended claims.

SUMMARY OF THE INVENTION

The present invention discloses a novel spectrofluorometic method of imaging photogenerated acid catalysts in chemically amplified photoresists. The invention comprises a method based on single molecule probing of acid concentration to measure the diffusion or profiles of photogenerated acids in chemically amplified resist films. The method of the invention measures at the molecular level fluorescent light emitted from pH-dependent dyes or fluorophores that are doped into chemically active resist films at low levels (i.e., ppb range, preferably 100 ppb or less) and are responsive to photogenerated acid catalysts produced by photolytic decomposition of photogenerator compounds in resist matixes. The invention also provides chemically amplified photoresist compositions that comprise low levels of pH-dependent fluorophores. Various resist formulation, various photacid generator compounds, and various pH-dependent fluorophores may be employed in the invention.

DESCRIPTION OF THE PREFERRED EMBODIMENTS

Figure 1A:
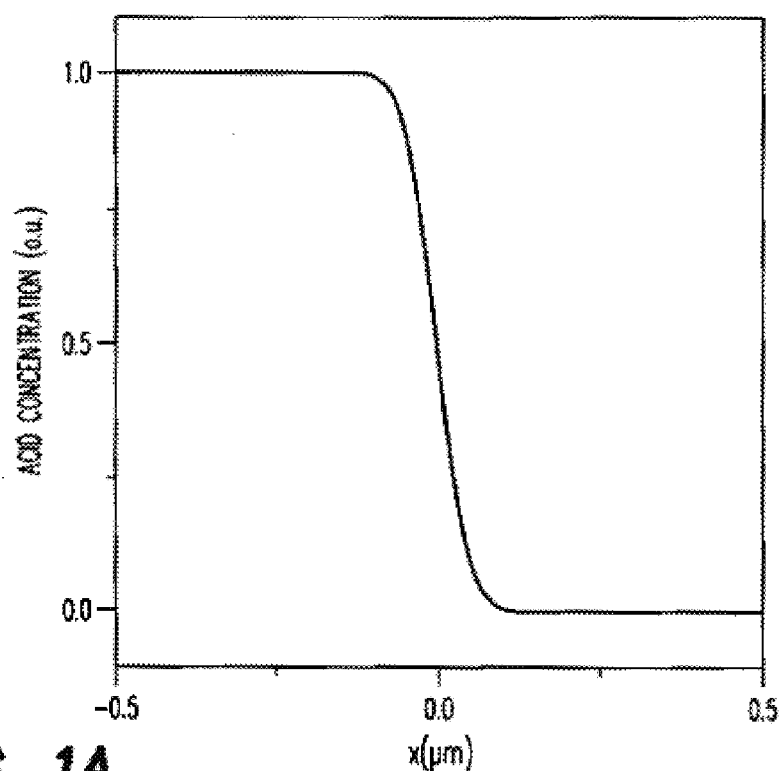
FIG. 1A is a graphic simulation of an acid concentration profile (a step function in acid concentration after Fickean diffusion with 40 nm diffusion length) in a resist film.

In its most general form, the present invention discloses a spectrofluorometric method for the measurement of the profiles of photogenerated acid patterns in chemically amplified resists by means of localization of single, pH sensitive fluorescent molecules.

As used in this disclosure, the term "fluorophore" is a fluorescent dye. A pH-dependent fluorophore is a fluorescent dye that fluoresces (i.e., absorbs and emits light at different wavelengths) wherein the intensity of the emitted light is functionally related to the pH of the particular environment. The term "resist" is used synonymously with "photoresist". The photoresists of the invention are chemically amplified photoresists. Chemically amplified photoresists are well known in the art and typically comprise a polymeric resin or binder and a photoacid generator. Representative CARSs are disclosed in U.S. Pat. Nos. 5,882,844; 5,492,793; 5,625,020; 5,712,078; 5,252,435; 5,258,257; 5,352,564; 4,491,628; 4,946,759; 4,946,760; and 5,210,000; all of which are incorporated herein by reference.

Chemically amplified photoresists of the present invention comprise a photoacid generator. PAGs that may be used include any variety of compounds known in the art that can generate an acid upon exposure to light energy. Representative PAGs include without limitation various nitrobenzyl compounds, sulfonic acid compounds, carbonic acid compounds, metallic, metaloid, and non-metallic onium salts. PAGs are described in U.S. Pat. Nos. 4,102,687; 5,258,257; and 4,371,605, all of which are incorporated herein by reference. Other photoacid generators known in the art will be useful in the practice of the invention, including, but not limited to, compounds such as triphenyulsulfonium triflate (TPSOTf), di(1-naphthyl)phenylsulfonium triflate (DNPSOTf), di[(4-t-butyl)phenyl]ikodonium triflate (DTBPIOTf), and N-(trifluoromethanesulfonyloxy)-5-norbornene-2,3-dicarboximide (MDT). It is understood that many PAGs have been developed for the industry and will continue to be developed for suitability with future products. These various CARs my be employed with the present invention.

Chemically amplified photoresists of the invention will comprise at least one species of pH-dependent fluorophore at a concentration in the resist film that will enable spectrofluorometic detection of individual molecules. The thickness of the film may vary and represents a certain volume thereafter viewed by the microscopic detection means of the present invention.

The field of view is typically considered to be the entire field of view of a microscope, generally 100×100 microns. The resolution volume is distinct from the minimum resolvable volume which is defined in terms of the diffraction limit. In the present invention, it is the minimum resolvable volume that is important. To further explain, in general terms the minimum resolvable volume is defined laterally by the transverse resolution, 0.6 λ/NA, where λ is the optical wavelength and NA is the numerical aperture of the imaging system and equal to the sine of the half angle of the converging beam, and defined vertically as the depth of focus, $\lambda/(NA)^2$. The resulting volume is then of the order $(0.6\ \lambda/NA)\times(0.6\ \lambda/NA)\times\lambda/(NA)^2$. It should be noted that when dealing with films thinner than the depth of focus, the relevant vertical length scale is the thickness of the film and not $\lambda/(NA)^2$. The objective of the doping of the film with fluorophore is to have no more than one of a particular type of fluorophore in this minimum resolvable volume. As exemplified herein with coumarin 6, was shown to be consistent with a doping level of the fluorophore into the resist of 10 parts per billion or less by weight. With weight known, the dopant identified, and the volume identified, it is understood that the doping levels could if so desired be expressed as molar concentrations.

For example, a common film thickness of 400 nm might have a representative fluorophore at a concentration of approximately 1.0 part per billion by solid content. In the case of a representative 400 nm thick film, it was found that doping of the fluorophore coumarin 6 into the resist was effective at 10 parts per billion or less by weight. With knowledge of the resist volume in question and the selected fluorophore, the concentration of dye required for doping of the resist formulation can be determined. Any fluorophore that is pH-dependent, properly matched by pH chemistry to the film, and provided with knowledge of the film thickness at the proper concentration to the selected film may be used in the practice of the present invention, the selection of which may be made by those skilled in the art. There are many pH-dependent fluorophores know in the art, including but not limited to those listed in U.S. Pat. Nos. 4,945,171; 5,387,527; 4,774,339; 5,302,731; 5,227,487; 5,442,045; "Practical Fluorescence" by G. G. Guilbault (1973); and Chapter 23 of *Handbook of Fluorescent Probes and Research Chemicals, Sixth Edition* (1996), all of which are incorporated herein by reference.

With regard to the selection of the fluorophore, the pKa of the dye should be matched closely to the acid content of the film prior to radiation exposure. The pKa of the fluorophore should be within about one pH unit of the chemically amplified photoresist, and preferably within 0.5 pH unit or less. With the qualification that the fluorophore concentration requirements of the present invention are met permitting detection at the molecular level, more than one pH-dependent fluorophore may be incorporated into the resist which may fluoresce at different pH levels or respond to different radiation wave lengths. CAR formulations are typically applied to a substrate surface (i.e., silicon wafer or other substrates known in the art) by spinning, dipping, or other conventional coating techniques at various thicknesses.

Proper concentration of fluorophore in the resist is an important component of the invention enabling molecular level detection sensitivity. It is preferred to have no more than one of a particular type of fluorophore in the minimum resolvable volume at the time that fluorescence is microscopically detected. Accordingly, the dopant concentration must take into consideration the thickness of the film which defines a volume. This volume can be determined as described herein and calculating the amount of fluorophore necessary to preferably provide at least one fluorophore molecule to this volume.

The image of the acid in the photoresist may be detected using any means of visualizing low level fluorescent know in the art, including, but not limited to, fluorescence detection microscopy, and digital imaging fluorescence microscopy. The apparatus that irradiates the resist may or may not be the same apparatus that generates the image.

The invention is further illustrated but not limited by the examples set forth below.

EXAMPLE 1

Simulation

Figure 1B:
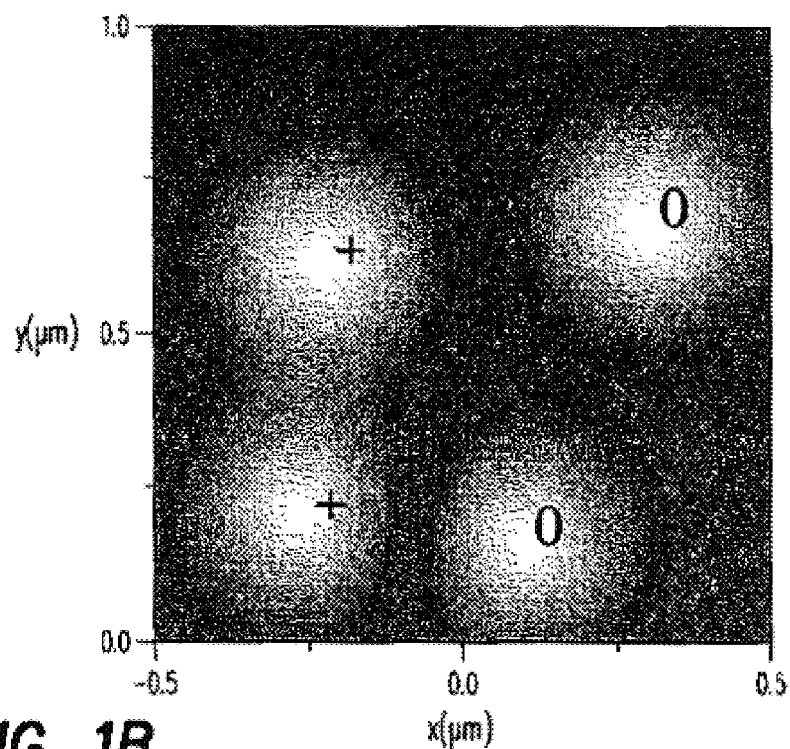
FIG. 1B is a simulation of an image of isolated, pH sensitive fluorescent molecules randomly distributed in the resist film ("0" and "+" represent spectral character indicating acid concentrations of 0 and 1 a.u., respectively).

A 1 micron wide acid concentration profile is shown in FIG. 1A. The profile is a simulation of a step function in acid concentration, photogenerated in the left half plane of the resist film, which has undergone diffusion assuming a 40 nm Fickean diffusion length. A simulated 1×1 micrometer image of isolated fluorescent molecules, randomly distributed in this resist film, is shown in FIG. 1B. For simplicity, the microscope point spread function is assumed to be Gaussian with width w=300 nm. The error in the measurement of the position of such Gaussian peaks as calculated by van Oijen et al. (*J. Opt. Soc. Am.*, A16, 909) is where N is the total number of detected photons per peak and Poisson statistics is assumed (i.e., the square root of N is the SNR). Assuming N=1000 yields x,y=10 nm, which is the size of the boxes in FIG. 1B.

Figure 1C:
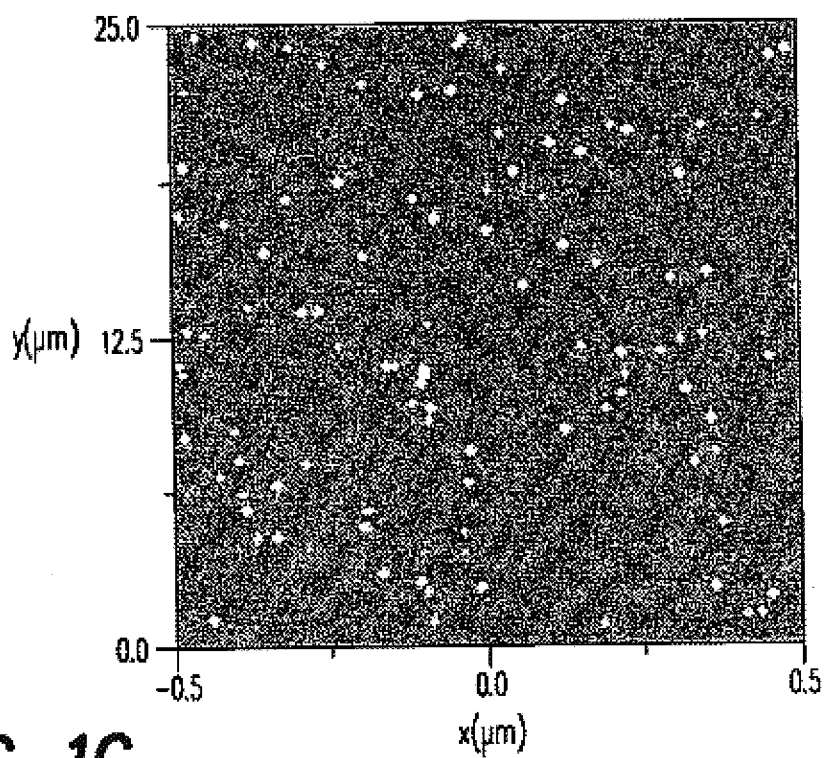
FIG. 1C is a simulation of a map of the positions of randomly distributed isolated molecules.

The spectral properties of the dopant molecule are sensitive to pH. The spectral properties of the molecule sensing acid concentrations of 0 and 1 a.u. are represented by the labels adjacent to the data markers: 0 and +, respectively. Therefore, molecules in the left half plane have the "+" spectral character, whereas those in the right half plane have the "0" spectral character. A simulated 1×25 micrometer map of the positions of isolated molecules randomly distributed in the resist film is shown in FIG. 1C. Again, "+" molecules are in the left half plane and "0" molecules are in the right half plant. The molecules near x=0 share both spectral characters. At the single molecule level, this sharing of spectral character is manifested as time-averaged blinking of molecules between the "0" and "+" states. If the molecule behavior is strictly ergodic, the spectral character is described by titration theory and is therefore directly indicative of the acid concentration in the molecule's local environment. Non-ergodic behavior would introduce error in the acid concentration measurement.

Figure 1D:
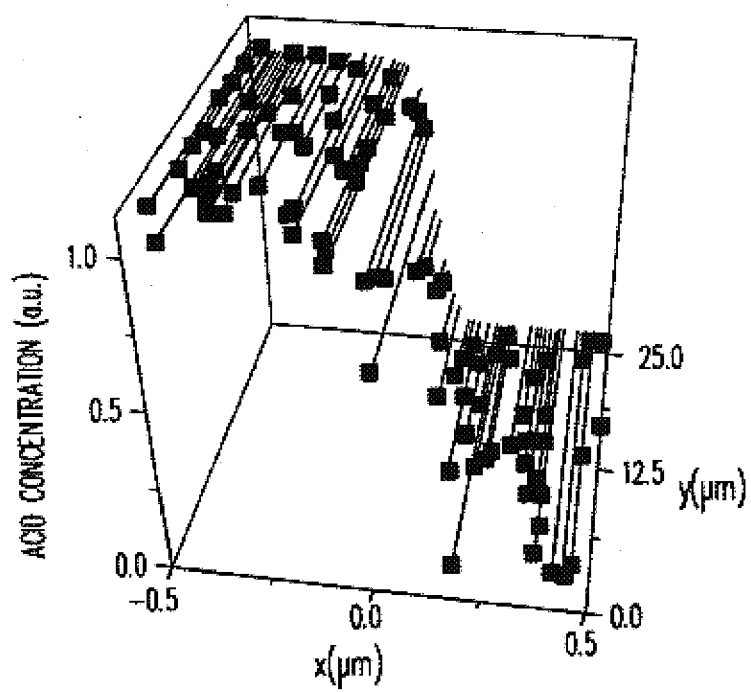
FIG. 1D is a three dimensional scatter plot of the positions (x and y coordinates) and indicted acid concentrations (z coordinates) of the molecules. The projection into the x-z plane traces out the acid concentration profile with a resolution given by the accuracy in the measurement of the x positions of the molecules.

A three dimensional scatter plot of each molecule's position (x and y coordinates) and indicated acid concentration (z coordinate) is shown in FIG. 1D. The projection of this scatter plot on the x-z plane traces out the acid concentration profile. Thus, the acid concentration profile can be mapped with a resolution limited by the accuracy in the measurement of the x positions of the molecules, of which 10 nm is a reasonable estimate. It should be mentioned that the choice of a step function as the initial acid concentration profile is purely for demonstration of the sensitivity of the technique; in practice the width of the initial profile is limited by the resolution of the exposure wavelength and numerical aperture.

EXAMPLE 2

Acid Imaging in a Chemically Amplified Photoresist

Coumarin 6, a commercially available laser dye whose utility for measurements of acid concentrations has been demonstrated in several investigations of photoresist and related materials, was doped into a 193 nm prototype CAR formulation at a concentration of 10 parts per billion (vs. solids content). The formulation was spin coated to a thickness of approximately 0.4 micrometers (a standard thickness for 193 nm lithography) onto a 6 inch bare silicon wafer which received a post-application bake at 120° C. for 60 seconds.

A Zeiss Axioskop 50 microscope operated in epi-fluoresce mode was used to image the fluorophore doped resist film. Light from a 75 W xenon arc lamp is transmitted through a ground glass diffuser and a 470±20 nm excitation filter, reflected by a 497 nm long pass dichroic beam splitter, and imaged into the sample with a dry, 0.9 numerical aperture, 100×, infinity corrected microscope objective. The collected fluorescence is transmitted through the dichroic beam splitter, a 515±15 nm filter, and a 500 nm long pass filter, and is imaged onto a liquid nitrogen cooled 512×512 array 24×24 um pixel CCD camera with 16 bit resolution by a combination of the microscope tube lens and a negative lens for additional magnification (a total of 492×).

Figure 2A:
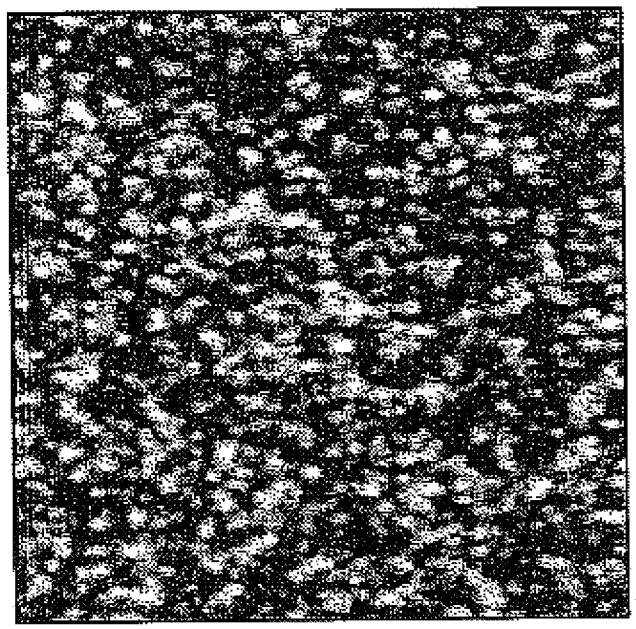
FIG. 2A is a 25×25 image of a 0.4 mm thick, 193 nm CAR film doped with 10 ppb (vs. solids content) coumarin 6.
Figure 2D:
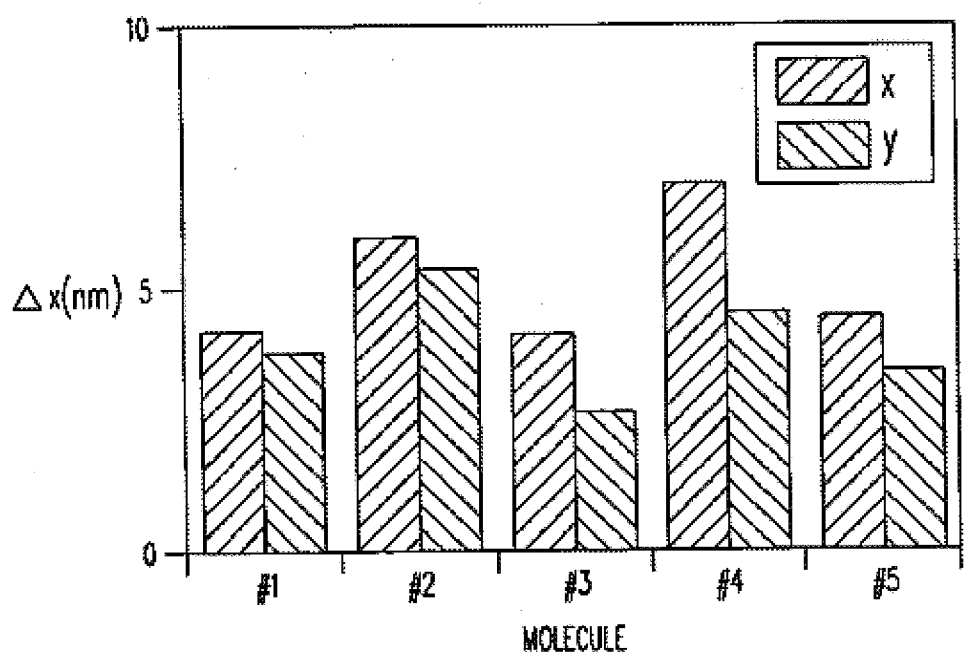
FIG. 2D shows the error in the measurement of the position of the molecules (approximately 5 nm).
Figure 2B:
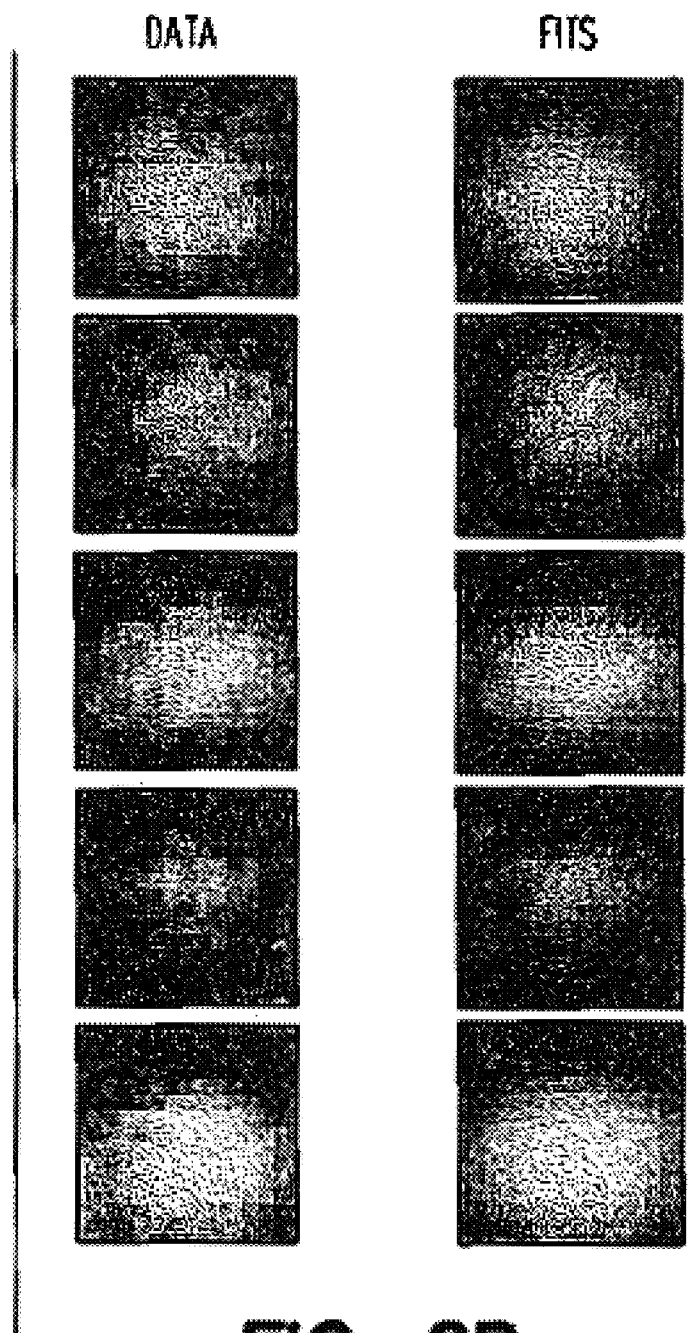
FIG. 2B shows 720×720 nm fields of view of five molecules selected from FIG. 2A ("Data") and Gaussian fits to the data ("Fits").
Figure 2C:
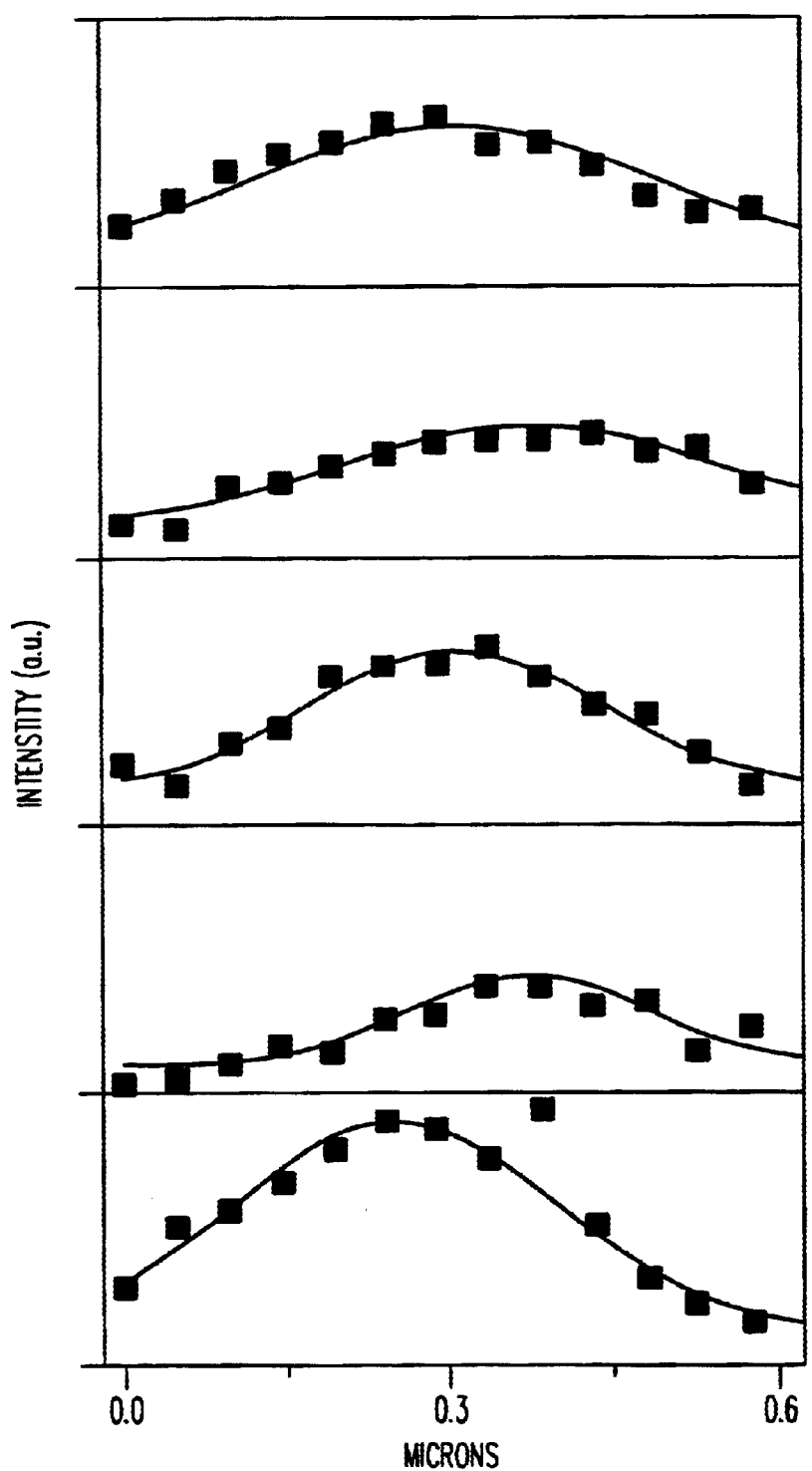
FIG. 2C shows profiles of the Data and Fits in FIG. 2B along the y axis.

An example of an image of the resist film is shown in FIG. 2A. The field of view is 25×25 um. Fluorescent spots are believed to be single molecules. Five of these spots were analyzed by fitting to them a two dimensional Gaussian function. The free parameters of the fit were the amplitude, baseline, width, and position (x and y coordinates). The data and fit functions for each spot are shown in FIG. 2B. Profiles of the data along the y axis are shown in FIG. 2C. The error in the measurement of the position of the molecules is shown in FIG. 2D. The SNR is high enough to obtain a 5 nm accuracy. These data demonstrate a viable method for the measurement of acid concentration profiles with spatial resolution limited by the SNR of single molecule detection.

In summary, a spectrofluorometric-based method for imaging or measuring the diffusion of photogenerated acid catalyst in chemically amplified photoresists is disclosed herein. The method provides a rapid and sensitive method for imaging acid in chemically amplified photoresists. The method of the present invention uses a low concentration of pH-dependent fluorophore that enables the detection of fluorescence at the molecular level. Various resist formulations, various photoacid generator compounds, and various pH-dependent fluorophores may be employed.

The present invention may be embodied in other specific forms than those exemplified without departing from the spirit or essential characteristics of the invention. The presented embodiments are meant to be considered in all respects as illustrative and not restrictive or limitative of the scope of the invention. Although the invention describes in detail certain embodiments, it is understood that variations and modifications exist which are within the scope of the invention as set forth in the following claims.

What is claimed is:

1. A method of imaging acid in a chemically amplified photoresist comprising the steps of:

exposing said chemically amplified photoresist to radiation thereby generating an acid, said chemically amplified photoresist comprising at least one species of pH-dependent fluorophore that fluoresces in the presence of said acid, said pH-dependent fluorophore being present at a concentration that enables the fluorescence from individual molecules of said pH-dependent fluorophore to be individually resolved for probing of said chemically amplified photoresist; and generating an image of the acid in the photoresist, said image comprising at least one or a plurality of discrete points corresponding to the fluorescent emission from an individual molecule or molecules of the pH-dependent fluorophore.

2. A method according to claim 1 wherein the chemically amplified photoresist comprises a photoacid generator.

3. A method according to claim 2 wherein the photoacid is activated by a post-exposure bake.

4. A method according to claim 1 wherein the generating of the image comprises digital imaging fluorescence microscopy.

5. A method according to claim 1 further comprising the steps of:

determining a location of each molecule in the image from its fluorescent emission; and deriving an acid profile based on said determined locations.

6. A method according to claim 1, further comprising the steps of:

determining a location of each molecule in the image from its fluorescent emissions; and deriving an indication of a diffusion of the acid in the photoresist based on the determined locations.

7. A method according to claim 1, wherein the fluorophore is present at a concentration less than 100 parts per billion by weight.

8. A method according to claim 1, wherein the fluorophore is present at a concentration of 10 parts per billion by weight or less.

9. A method of measuring properties of acid in a chemically amplified photoresist comprising the steps of:

doping said chemically amplified photoresist with a species of pH-dependent fluorophore that fluoresces in the presence of said acid, said pH-dependent fluorophore being present at a concentration that enables fluorescence from individual molecules of said pH-dependent fluorophore to be individually resolved for probing of said properties of said acid;

exposing said chemically amplified photoresist to radiation thereby generating said acid; and generating an image of said acid in said chemically amplified photoresist, said image comprising at least one or a plurality of discrete points corresponding to the fluorescent emission from an individual molecule or molecules of the pH-dependent fluorophore.

10. A method according to claim 9, wherein generating said image of said acid includes generating a minimum resolvable volume for said chemically amplified photoresist, and wherein said concentration of said pH-dependent fluorophore results in no more than one of said species of pH-dependent fluorophore being present in said minimum resolvable volume when said image is generated.

11. A method according to claim 9, wherein the chemically amplified photoresist comprises a photoacid generator.

12. A method according to claim 11, wherein the photoacid is activated by a post-exposure bake.

13. A method according to claim 9, wherein the generating of the image comprises digital imaging fluorescence microscopy.

14. A method according to claim 9, further comprising the steps of:

determining a location of each molecule in the image from its fluorescent emissions; and deriving an acid profile based on said determined locations.

15. A method according to claim 9, further comprising the steps of:

determining a location of each molecule in the image from its fluorescent emissions; and deriving an indication of a diffusion of the acid in the photoresist based on the determined locations.

16. A method according to claim 9, wherein the fluorophore is present at a concentration less than 100 parts per billion by weight.

17. A method according to claim 9, wherein the fluorophore is present at a concentration of 10 parts per billion by weight or less.

* * * * *